United States Patent [19]

Armini

[11] Patent Number: 5,894,133
[45] Date of Patent: Apr. 13, 1999

[54] SPUTTER CATHODE FOR APPLICATION OF RADIOACTIVE MATERIAL

[75] Inventor: Anthony J. Armini, Manchester, Mass.

[73] Assignee: Implant Science Corporation, Wakefield, Mass.

[21] Appl. No.: 08/769,240

[22] Filed: Dec. 18, 1996

[51] Int. Cl.$^6$ ................................................ H01J 37/317
[52] U.S. Cl. ........................................................ 250/492.3
[58] Field of Search ........................................ 250/492.3

[56] References Cited

U.S. PATENT DOCUMENTS

| | | | |
|---|---|---|---|
| 3,992,632 | 11/1976 | Kruger et al. | 250/423 R |
| 4,045,677 | 8/1977 | Humphries, Jr. et al. | 250/423 R |
| 4,124,802 | 11/1978 | Terasawa et al. | 250/492 A |
| 4,175,234 | 11/1979 | Hunt et al. | 250/427 |
| 4,321,467 | 3/1982 | Buttrill, Jr. | 250/288 |
| 4,465,524 | 8/1984 | Dearnaley et al. | 148/31.5 |
| 4,584,991 | 4/1986 | Tokita et al. | 128/1.1 |
| 4,586,490 | 5/1986 | Katz | 128/1.1 |
| 4,660,547 | 4/1987 | Kremer, Jr. | 128/1.1 |
| 4,714,074 | 12/1987 | Rey et al. | 128/1.1 |
| 4,715,359 | 12/1987 | Ryo | 128/1.1 |
| 4,803,977 | 2/1989 | Kremer, Jr. | 600/3 |
| 4,815,446 | 3/1989 | McIntosh | 600/3 |
| 4,831,270 | 5/1989 | Weisenberger | 250/492.2 |
| 4,869,835 | 9/1989 | Ogawa et al. | 250/423 R |
| 4,872,922 | 10/1989 | Bunker et al. | 148/4 |
| 4,881,937 | 11/1989 | van't Hooft et al. | 600/3 |
| 4,881,938 | 11/1989 | van't Hooft | 600/3 |
| 4,946,435 | 8/1990 | Suthanthiran et al. | 600/3 |
| 4,969,863 | 11/1990 | van't Hooft et al. | 600/3 |
| 5,030,194 | 7/1991 | van't Hooft | 600/3 |
| 5,047,648 | 9/1991 | Fishkin et al. | 250/492.2 |
| 5,059,166 | 10/1991 | Fishell et al. | 600/3 |
| 5,176,617 | 1/1993 | Fishell et al. | 600/3 |
| 5,342,283 | 8/1994 | Good | 600/8 |
| 5,393,986 | 2/1995 | Yoshinouchi et al. | 250/492.21 |
| 5,644,130 | 7/1997 | Raatz | 250/288 |

FOREIGN PATENT DOCUMENTS

| | | | |
|---|---|---|---|
| 04168722 | 6/1992 | Japan | H01L 21/26 |

OTHER PUBLICATIONS

Tim A. Fishell, MD et al., "Low–Dose β–Particle Emission From 'Stent' Wire Results in Complete, Localized Inhibition of Smooth Muscle Cell Proliferation" in Circulation 90 pp. 2956–2963 (1994).

Armini, "Formation of New Surface Alloys by Ion Implantation Technology", Article produced by Implant Sciences Corporation, Danvers, Massachusetts 01923, (Jan., 1986).

Janicki et al., "Production and Quality Assessment of Beta Emitting P-32 Stents for Applications in Coronary Angioplasty", Paper submitted to the 42$^{nd}$ Annual Meeting of the Canadian College of Physicist in Medicine, Jun. 20–22, 1996, University of British Columbia, Vancouver, Canada.

E.M. Goldys et al., "Germanium–doped gallium phosphide obtained by neutron irradiation," *J. Appl. Phys.* 74, vol. 4, pp. 2287–2293 (1993).

U.S. application No. 08/887,504, Bunker, filed Jul. 2, 1997.

U.S. application No. 08/867,888, Armini et al., filed Jun. 3, 1997.

U.S. application No. 08/887,508, Armini et al., filed Jul. 2, 1997.

(List continued on next page.)

*Primary Examiner*—Jack I. Berman
*Attorney, Agent, or Firm*—Foley, Hoag & Eliot LLP

[57] ABSTRACT

Making a sputter cathode for applying a radioactive material includes obtaining a wafer containing a base material having a stable precursor dissolved therein. The base material is transmutable into a material having a relatively short atomic half-life. The wafer is atomically activated to transmute a portion of the stable precursor into a radioactive material. The base material may be silicon or germanium. The stable precursor may be $^{31}$P and the radioactive material may be $^{32}$P. Atomically activating the wafer may include exposing the wafer to a source of thermal neutrons by, for example, placing the wafer in a high-flux nuclear reactor for approximately four weeks.

12 Claims, 4 Drawing Sheets

OTHER PUBLICATIONS

U.S. application No. 08/887,509, Bunker, filed Jul. 2, 1997.

Daniel, et al., A New, Rapid Safe Method for Local Radiation of Intrathoracic Sites, *The American Surgeon*, 1989, vol. 55, No. 9, pp. 560–562.

Goldberg, et al., In vivo aortic smooth muscle cell (SMC) kinetics: response to irradiation in the rat, *Cell Tissue Kinet*, 1982, vol. 15, No. 6, p. 675.

Hessel, et al., Angiography and Vasa Vasorum Blood Flow After Aortic Dilatation, *Investigative Radiology*, Sep.–Oct. 1978, p. 404.

Lee, et al., Effects of Laser Irradiation on Cardiac Valves: Technique of Transcatheter In–Vivo Vaporization of Aortic Valve, *Laser Surg. Med.*, 1983, vol. 3, No. 2, pp. 174–175.

Lee, et al., Laser irradiation of human atherosclerotic obstructive disease; Simultaneous visualization and vaporization achieved by a dual fiberoptic catheter,*American Heart Journal*, 1983, vol. 105, No. 1, pp. 163–164.

Lee, et al., Effects of laser irradiation on cardiac valves: Transcatheter in vivo vaporization of aortic valve,*American Heart Journal*, Feb. 1984, vol. 107, p. 394.

Solomon, et al., An in vivo method for the evaluation of catheter thrombogenicity,*Journal of Biomedical Materials Research*, 1987, vol. 21, pp. 43–57.

Rosch et al., Gianturco Expandable Wire Stents in the Treatment of Superior Vena Cava Syndrome Recurring After Maximum–Tolerance Radiation,*Cancer*(Phila.), 1987, vol. 60, No. 6, pp. 1243–1246.

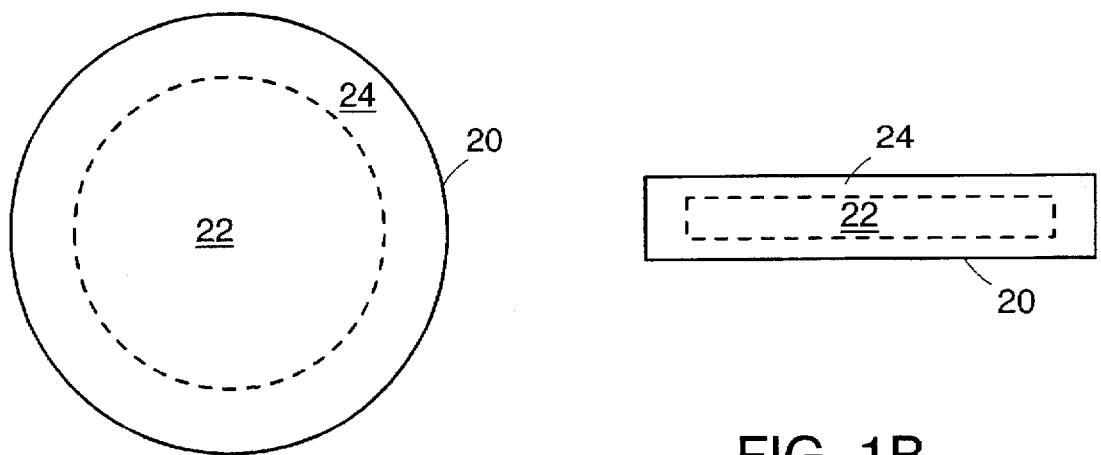
FIG. 1B
FIG. 1A
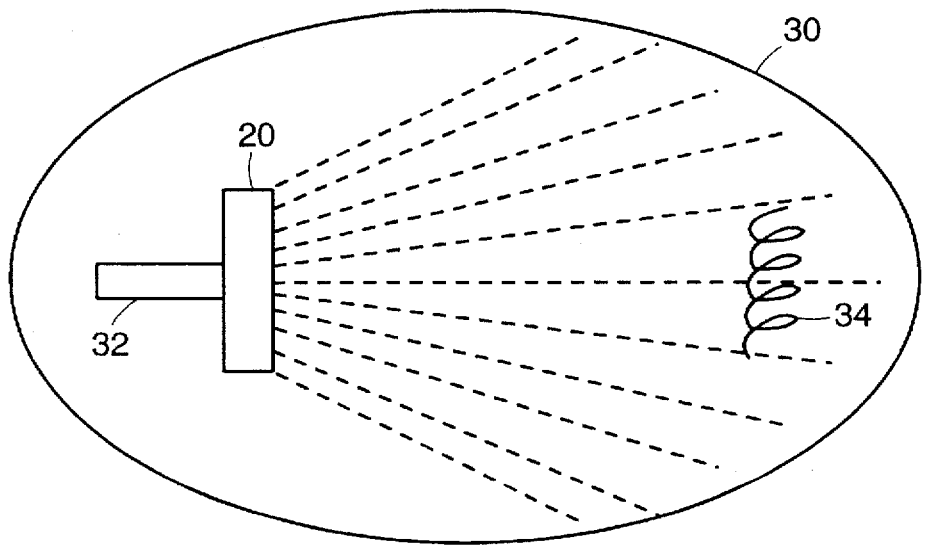
FIG. 2

SPUTTER CATHODE FOR APPLICATION OF RADIOACTIVE MATERIAL

TECHNICAL FIELD

This application relates to the field of manufacturing radioactive objects and more particularly to the field of manufacturing radioactive objects that are surgically implanted.

BACKGROUND OF THE INVENTION

In many instances, it is desirable to cause a normally non-radioactive object to become radioactive by imbedding or applying radioactive material the normally non-radioactive object. For instance, in the case of intra-arterial stents used to prevent restenosis or reclosure of the artery subsequent to balloon angioplasty or atherectomy, it has been found that causing the stent to be radioactive irradiates the tissue in close proximity to the implantation site of the stent, thus reducing rapid tissue growth around the stent. Reducing the rapid tissue growth decreases the likelihood of restenosis.

A radioactive stent described in U.S. Pat. No. 5,059,166 to Fischell et al. (the '166 patent) shows a helical spring stent that is caused to be radioactive prior to insertion into the artery. The '166 patent discusses various techniques for causing the stent to be radioactive, including using radioisotopes in the manufacture of the stent and/or plating the stent with a radioisotope coating. Although the '166 patent generally describes a process for making the stent radioactive, it may be assumed that using radioisotopes and/or applying a radioactive coating would require handling of radioactive material in a manner which may be unacceptable for mass production purposes.

An alternative approach for creating a radioactive stent involves using a cyclotron to bombard stainless steel stents with a proton beam to produce radioactive isotopes within the stent. However, these isotopes have high-energy gamma emissions and long half-lives that make this technique impractical for humans. Gamma emissions increase the whole-body dose of radiation while having relatively little therapeutic effect on local tissue compared to the effect of beta emissions. In addition, it has been found that long half-life materials are less appropriate since optimum radioactivity-mediated inhibition is more likely to be achieved by a continuous exposure for the first few weeks following the insertion of the stent. Accordingly, a half-life of a few weeks (i.e., one to seven weeks) is deemed ideal for this purpose.

Another technique for manufacturing radioactive stents involves first implanting massive doses of $^{31}P$ in titanium stents. The $^{31}P$ is subsequently activated by a nuclear reactor to produce $^{32}P$. However, this technique requires up to thirty atomic percent $^{31}P$ under the surface of the titanium stent, which alters the chemical composition of the alloy with unpredictable effects on the mechanical and biocompatibility properties of the stent. In addition, the titanium metal stent may have impurities which, when bombarded in a nuclear reactor, create isotopes that emit substantial gamma rays and have long half-lives similar to the isotopes in the stainless-steel stents that are bombarded in a nuclear reactor.

An article titled, "Production and Quality Assessment of Beta Emitting P-32 Stents for Applications in Coronary Angioplasty", by Janicki et al. discusses using ion beam implantation to implant radioactive $^{32}P$ isotopes into a titanium stent. Although the ion beam implantation technique itself appears to result in a radioactive stent having acceptable characteristics, Janicki et al. disclose performing the ion beam implantation using radioactive cathodes that are prepared using radioactive sats which are first dissolved into liquids and then dried onto the cathode. Handling the thus-formed radioactive liquids may be unacceptable for mass production. In addition, the resulting radioactive salts that are dried onto the cathode may fall off and contaminate workers in a mass production setting.

SUMMARY OF THE INVENTION

According to the present invention, making a sputter cathode for applying a radioactive material includes obtaining a wafer containing a base material having a stable precursor dissolved therein, where the base material is transmutable into a material having a relatively short atomic half-life, and then atomically activating the wafer to transmute a portion of the stable precursor into a radioactive material. The base material may be silicon or germanium. The stable precursor may be $^{31}P$ and the radioactive material may be $^{32}P$. Atomically activating the wafer may include exposing the wafer to a source of thermal neutrons by, for example, placing the wafer in a high-flux nuclear reactor for approximately four weeks.

The stable precursor (e.g., $^{31}P$) may be dissolved into the base material (e.g., silicon) using thermal diffusion where the $^{31}P$ may be diffused into the silicon at a depth between one micron and 500 microns and the concentration of $^{31}P$ at the surface of the silicon may be between 0.01 and 50 atomic percent. Alternatively, the wafer may be an alloy of the base material (e.g. silicon) and the stable precursor (e.g., $^{31}P$) and the alloy may contain between 0.01 and 50 atomic percent $^{31}P$.

The wafer may be approximately circularly shaped and have a diameter of 4 inches and a thickness of 0.5 mm. Prior to atomically activating the wafer, the wafer may be cut into portions suitable for use as a sputter-type ion source of an ion beam implantation device. Alternatively, the wafer may be configured to operate in connection with a magnetron sputter coating device. Prior to atomically activating the wafer, a coating material that is transmutable into a material having a relatively short atomic half-life may be applied to the wafer. The coating material may be less than 10 microns thick. The coating material may be the same material as the base material (e.g. silicon).

According further to the present invention, a solid-state radioactive cathode includes a base material that is transmutable into a material having a relatively short atomic half-life and includes a radioactive material dissolved into the base material. The cathode may further include a surface coating material transmutable into a material having a relatively short atomic half-life that is used to substantially encapsulate the cathode. The coating material may be less than 10 microns thick and may be the same material as the base material (e.g. silicon) while the stable precursor may be $^{31}P$. The $^{31}P$ may be embedded into the silicon at a depth of between one micron and 500 microns.

According further to the present invention, an object is made radioactive by using a solid-state radioactive cathode, as described above, as a source of radioactive atoms and by then accelerating the radioactive atoms toward the object. The object may be a medical implant, such as an intra-arterial stent.

BRIEF DESCRIPTION OF DRAWINGS

FIG. 1A and 1B show a top view and side view, respectively, of a sputter cathode according to the present invention.

FIG. 2 is a schematic diagram illustrating use of the sputter cathode in a magnetron-type sputtering device.

DETAILED DESCRIPTION OF THE PREFERRED EMBODIMENTS

Figure 3:
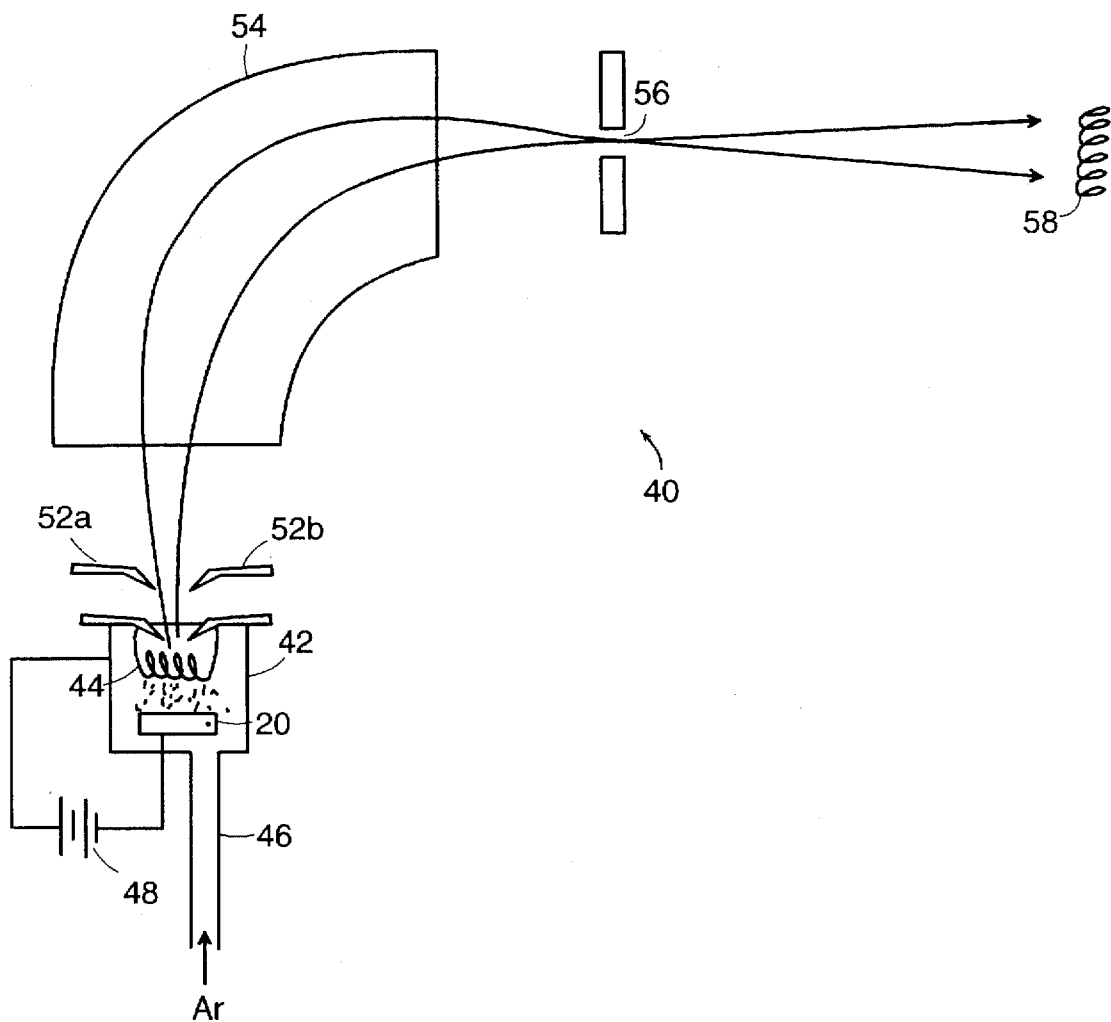
FIG. 3 is a schematic diagram showing use of the sputter cathode in an ion beam implantation device.

Referring to FIG.'s 1A and 1B, a radioactive sputter cathode 20 includes a radioactive central portion 22 and a non-radioactive coating 24. In the embodiment illustrated herein, the cathode 20 is an approximately circularly-shaped wafer having a diameter of about four inches and a thickness of about 0.5 mm. However, as will become apparent from the following discussion, the technique disclosed herein may be used to provide sputter cathodes of numerous sizes and shapes depending upon the ultimate end use of the cathode. In the embodiments illustrated herein, the cathode 20 is made sufficiently thin to be used in a magnetron sputtering device and/or as a sputter source in an ion beam implantation device.

A radioactive central portion 22 includes a silicon base having, for example, radioactive $^{32}P$ embedded therein. The non-radioactive coating 24 encapsulates the radioactive central portion 22 and is provided in order to facilitate handling of the cathode 20. The non-radioactive coating 24 may be made of silicon and have a thickness of 10 microns or less.

Referring to FIG. 2, the cathode 20 may be used in a chamber 30 of a conventional magnetron sputtering device, such as that manufactured by AJA International, Inc. of Scituate, Mass. The sputtering device includes a conventional driver 32 that drives material from the cathode 20. In the example illustrated in FIG. 2, a helical spring intra-arterial stent 34 is shown being coated by the material driven from the cathode 20. Since the cathode 20 contains radioactive material (e.g., $^{32}P$), then driving material from the cathode 20 in the direction of the stent 34 causes the stent to be coated with the same radioactive material. The thus-formed radioactive stent 34 may be used in humans subsequent to balloon angioplasty to prevent restenosis, as described in, for example, U.S. Pat. No. 5,059,166 to Fischell et al., which is incorporated herein by reference.

Note that $^{32}P$ is an especially desirable material for coating the stent 34 since $^{32}P$ emits only beta rays (or at least greater than 99.99% beta rays) as opposed to gamma rays and has a relatively short (14 day) half-life. Note also that in this application, the stent may be made of stainless steel, titanium, nitinol, or any other material suitable for accepting the $^{32}P$ coating as applied by the sputtering device and for being used in humans to prevent restenosis.

Referring to FIG. 3, the sputter cathode 20 may be used in connection with a conventional ion beam implantation device 40, such as the Baton N-3206 manufactured by Eaton Corporation of Austin, Tex. In this instance, the device 40 uses an approximately square portion of the cathode 20 measuring approximately 2 cm. by 2 cm. Such a portion may be obtained by cutting the approximately four-inch diameter wafer shown in FIG.'s 1A and 1B into squares measuring approximately 2 cm. by 2 cm. The cathode 20 may be cut using conventional means, such as a diamond saw. Cutting the cathode 20 is discussed in more detail hereinafter.

The ion beam implantation device 40 includes an arc chamber 42 containing the cathode 20 and containing a filament 44. During operation, the arc chamber 42 is continuously filled with argon gas via an inlet 46. A negative electrical bias 48 is connected to the cathode 20 and the chamber in order to place a strong negative bias on the cathode 20.

The combination of heating the filament 44 and applying the negative voltage bias to the cathode 20 cause ions to exit from the arc chamber 42 through an evacuation slit formed by a pair of electrodes 52a, 52b. The ions that exit from the arc chamber 42 include ions from the cathode 20 along with ions of the argon gas.

The various ions are separated in a conventional manner by a mass analysis magnet 54 which causes an ion beam containing primarily the $^{32}P$ ions to pass through a mass analysis slit 56 and strike a helical spring stent 58, which is similar to the stent 34 discussed above in connection with FIG. 2. In a preferred embodiment, the stent 58 is made of stainless steel, although the stent 58 may be made of other material such as titanium, nitinol, or any other suitable material capable of being implanted via the $^{32}P$ ion beam and used in humans. Operation of the ion beam implantation device 40 occurs primarily in a vacuum of $10^{-6}$ torr.

Figure 4:
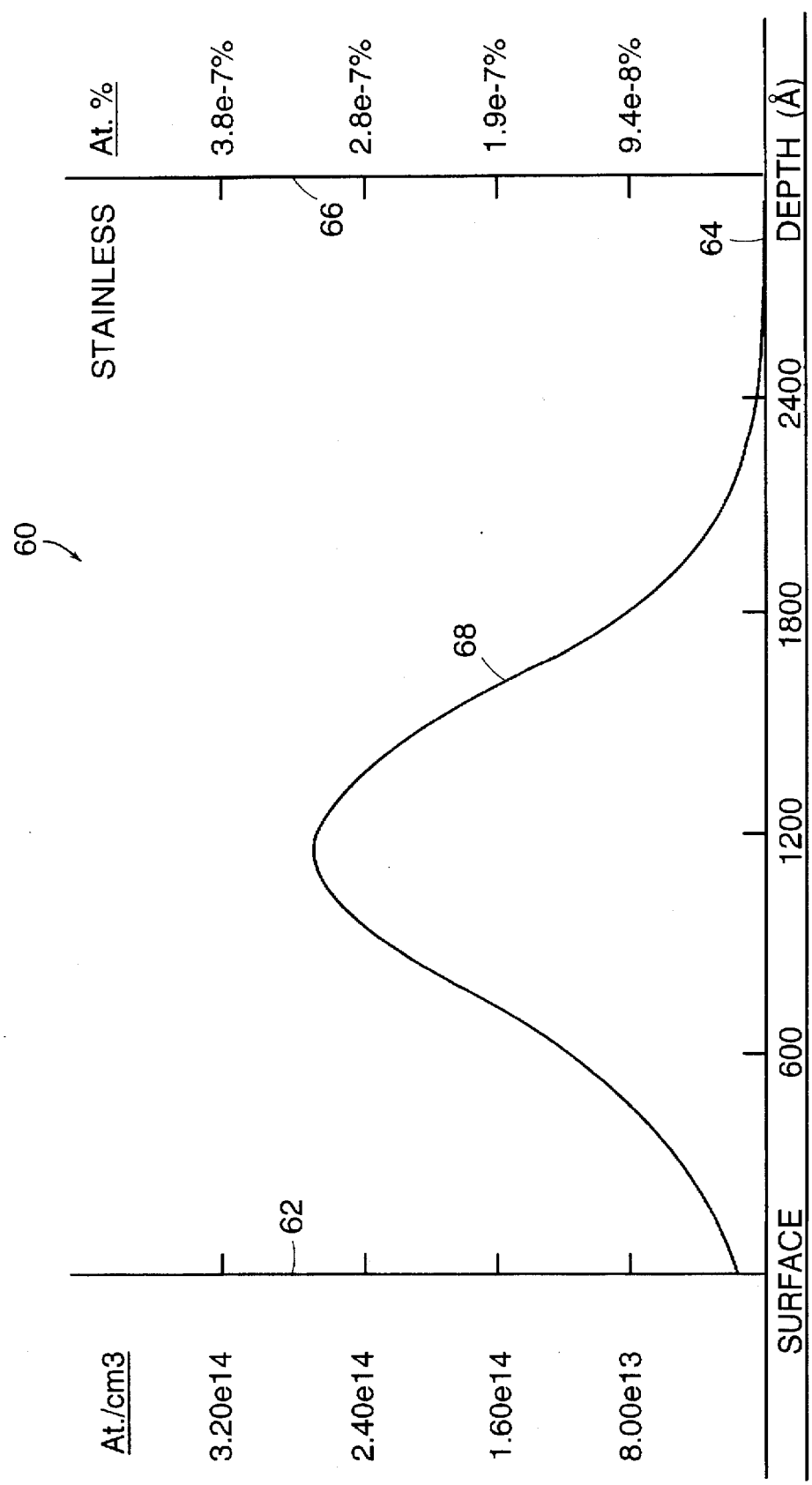
FIG. 4 is a graph indicating a relationship between depth of penetration in a stent and concentration of $^{32}P$ atoms.

Referring to FIG. 4, a graph 60 illustrates concentration of the $^{32}P$ at various depths in the stent 58 upon implantation via the device 40. The graph 60 includes a first vertical axis 62 indicating the number of atoms of $^{32}P$ per cubic centimeter of material and a horizontal axis 64 indicating depth of penetration (i.e., the distance from the surface of the stent 58). A second vertical axis 66 indicates atomic percent of $^{32}P$ atoms. Note that since the atomic percent of $^{32}P$ atoms is directly proportional to the number of $^{32}P$ atoms per cubic centimeter of material, then the first vertical axis 62 and the second vertical axis 66 represent essentially the same characteristic expressed in a different manner.

A plot 68 of the graph 60 indicates the number of $^{32}P$ atoms per cubic centimeter (and indicates the atomic percent of $^{32}P$ atoms) as a function of the depth of penetration within the stent 58. Note that in this particular example, the plot 68 indicates that the number of $^{32}P$ atoms per cubic centimeter peaks at a depth of approximately 1200 angstroms and that the peak value is approximately $2.8 \times 10^{-14}$ $^{32}P$ atoms per cubic centimeter of material. The peak value occurs at 1200 angstroms below the surface because the ion beam implantation device 40 embeds the atoms into the stent 58 using relatively high velocity ions. Of course, the plot 68 shown in FIG. 4 is exemplary only and a variety of other distributions are possible depending upon a number of factors including the nature of the cathode material, the nature of the material used to make the stent 58, the type of ion beam implantation device 40, and other operational factors familiar to one of ordinary skill in the art.

In one embodiment, the cathode 20 is manufactured using established semiconductor technology in which a wafer-shaped base material of hyper-.pure single crystal silicon is doped with a stable precursor of $^{31}P$ using a spin-on dopant of phosphorosilica film (such as that made by the Emulsitone Company of Whippany, N.J.). In this embodiment, the $^{31}P$ is driven into the silicon using an 1170°, seven-day drive-in. However, alternative embodiments may use drive-ins ranging between 10 and 1,000 hours and temperatures ranging between 1000 and 1300° C. Alternatively still, it may be possible to obtain an Si/$^{31}P$ alloy or to obtain silicon (or another suitable base material) that is heavily doped with a stable precursor such as $^{31}P$. The wafer may have dimensions similar to those discussed above in connection with FIG.'s 1A and 1B.

Figure 5:
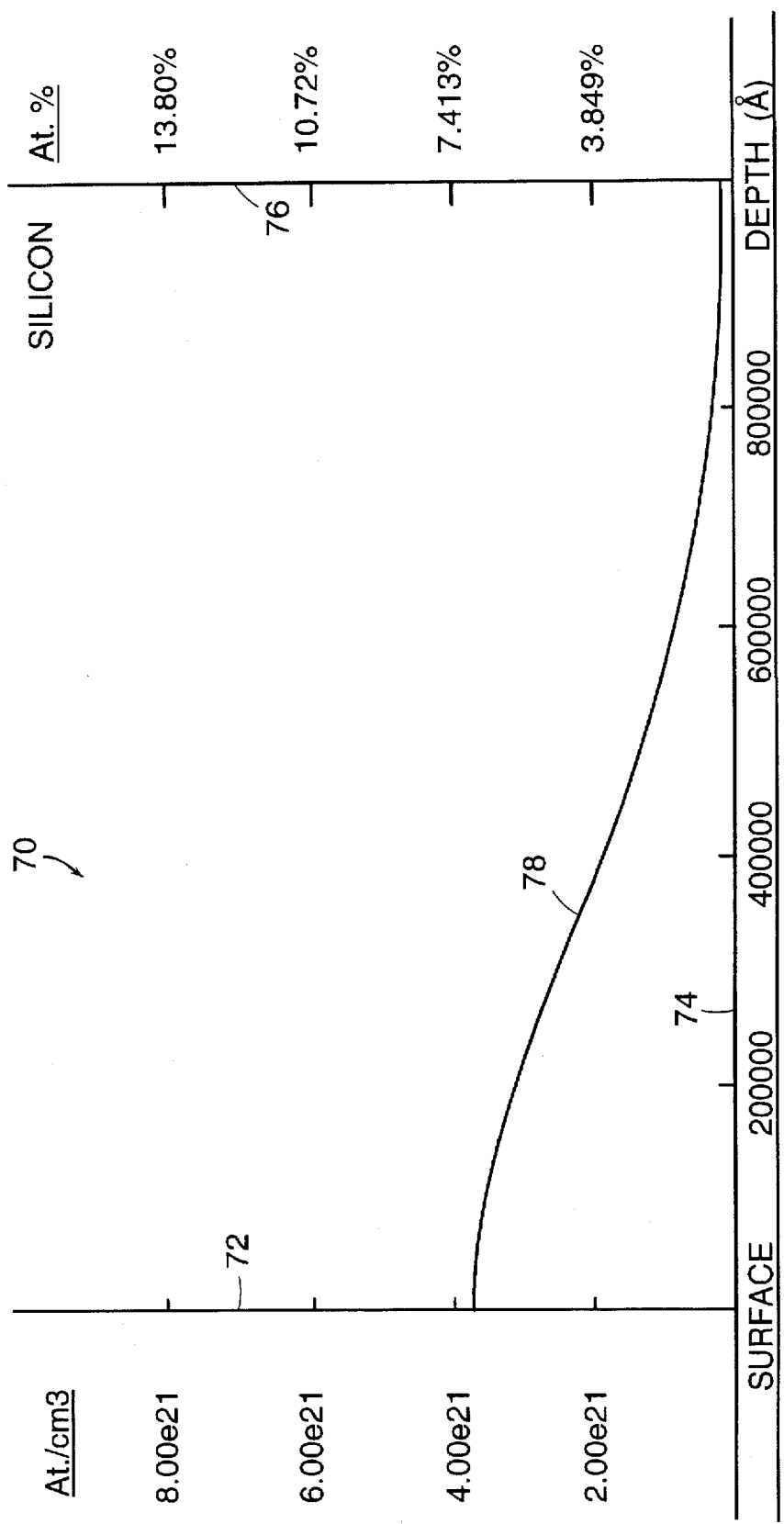
FIG. 5 is a graph indicating a relationship between depth of penetration in a silicon wafer and concentration of $^{31}P$ atoms.

Referring to FIG. 5, a graph 70 illustrates concentration of $^{31}$P at various depths in the wafer-shaped base material. The graph 70 includes a first vertical 72 indicating the number of atoms of $^{31}$P per cubic centimeter of material and a horizontal axis 74 indicating depth of penetration. A second vertical axis 76 indicates atomic percent of $^{31}$P atoms. Just as with FIG. 4, the atomic percent of $^{31}$P atoms is directly proportional to the number of $^{31}$P atoms per cubic centimeter so that the first vertical axis 72 and the second vertical axis 76 represent essentially the same characteristic expressed in a different manner.

A plot 78 of the graph 70 indicates the number of $^{31}$P atoms per cubic centimeter as a function of the depth of penetration within the base material. In this embodiment, the plot 78 shows the highest concentration of $^{31}$P atoms at the surface of the base material with the concentration monotonically decreasing as the depth of penetration increases. Of course, the plot 78 shown in FIG. 5 is exemplary only and a variety of other distributions are possible depending upon a number of factors including the nature of the base material, the nature of the stable precursor, the drive-in time and temperature, and a variety of other operational factors familiar to one of ordinary skill in the art.

Following diffusion of the $^{31}$P into the silicon, the base material is provided with a sealant coating of silicon using conventional means such as a commercial sputtering device. In the embodiment illustrated herein, the coating is less than 10 microns thick.

Following the coating step, the stable precursor, $^{31}$P, is atomically activated by placing the wafer in a nuclear reactor which transmutes a portion of the $^{31}$P into $^{32}$P, which is a pure beta emitter suitable for coating or being implanted into intra-arterial stents, as described above. If the dimensions of the wafer are too large for the intended end application, then the wafer may be cut (using, for example, a diamond saw) prior to being placed in the nuclear reactor. For instance, if a wafer having a four-inch diameter such as that discussed above in connection with FIG.'s 1A and 1B is used, then the wafer may be cut into squares measuring 2 cm.×2 cm. if it is desired that the wafer be used in the Eaton NV-3206 ion implantation device 40, discussed above. In the embodiment illustrated herein, the wafer (or portions of the wafer) are atomically activated by being placed in a high-flux nuclear reactor for approximately four weeks, although it will be appreciated by one of ordinary skill in the art that the wafer may be atomically activated using any source of thermal neutrons.

Note that although the silicon base of the wafer is bombarded in the nuclear reactor, the (substantially pure) silicon is transmuted into $^{31}$Si, which has a relatively short half-life (2.62 hours) and which, incidentally, decays into $^{31}$P. The thus-activated silicon will therefore become stable in a relatively short period of time (e.g., one week). Note also that using hyper-pure silicon reduces the likelihood of impurities being activated in the reactor and producing undesirable isotopes.

Although the embodiment illustrated herein uses silicon as a base element and $^{31}$P as a stable precursor, the invention may be practiced using any base material that can accept the stable precursor and that has a relatively short half-life, such as germanium. Note also that the material used to provide the sealed coating may be different than the base material used to accept the stable precursor, but that it is desirable that the material used for the coating have a relatively short half-life. In addition, although the invention has been illustrated herein using $^{31}$P as a stable precursor, the invention may be practiced using any material as a stable precursor provided that the material may be activated in a reasonable amount of time within a nuclear reactor (or other atomic activation means). The use of $^{31}$P is especially advantageous in the present application since the resulting transmuted element, $^{32}$P, emits only beta rays (or at least greater than 99.99% beta rays) which, as discussed above, is advantageous in use with intra-arterial stents or possibly other human implants. However, for other applications, it may be desirable to use a different atomic precursor having different characteristics when the precursor is atomically activated.

In addition, it will also be appreciated by one of ordinarily skill in the art that the invention includes making wafers of any number of different sizes and shapes depending upon the ultimate end-use of the wafer. The invention may be practiced without including the sealed coating on the wafer, although a wafer not having a sealed coating may be more difficult to handle since such a wafer would have atomically activated material on the outside surface thereof, thus increasing the likelihood that the atomic material could rub off or be brushed off of the final end product. The invention does not depend on how the stable precursor is dissolved into the base material.

While the invention has been disclosed in connection with the preferred embodiments shown and described in detail, various modifications and improvements thereon will become readily apparent to those skilled in the art. Accordingly, the spirit and scope of the present invention is to be limited only by the following claims.

What is claimed is:

1. A method of causing an object to become radioactive, comprising the steps of:
 (a) obtaining a solid-state radioactive cathode containing a base material that is transmutable into a material having a relatively short atomic half-life and containing a radioactive material dissolved into the base material;
 (b) using the cathode as a source of radioactive atoms; and
 (c) accelerating the radioactive atoms toward the object.

2. A method according to claim 1, wherein the cathode further includes a surface coating material, substantially encapsulating the cathode and being transmutable into a material having a relatively short atomic half-life.

3. A method according to claim 2, wherein the surface coating material is less than 10 microns thick.

4. A method according to claim 2, wherein the coating material is the base material.

5. A method according to claim 4, wherein the base material and the coating material are silicon and the radioactive material is $^{32}$P.

6. A method according to claim 1, wherein the base material is silicon and the radioactive material is $^{32}$P.

7. A method according to claim 6, wherein the $^{32}$P is embedded into the silicon at a depth of between one micron and 500 microns.

8. A method according to claim 1, wherein the base material is a wafer having a substantially circular shape, a diameter of approximately four inches, and a thickness of approximately 0.5 mm.

9. A method according to claim 1, wherein the base material is a wafer having a substantially square shape, an edge length of approximately 2 cm., and a thickness of approximately 0.5 mm.

10. A method according to claim 9, wherein accelerating the radioactive atoms toward the object includes using the cathode in a sputter-type ion source of an ion implantation device.

11. A method according to claim 1, wherein the object is a medical implant.

12. A method according to claim 11, wherein the object is an intra-arterial stent.

* * * * *